United States Patent
Koike (10) Patent No.: US 7,288,728 B2
(45) Date of Patent: Oct. 30, 2007

(54) ELECTRONIC PACKAGE AND PACKAGING METHOD

(75) Inventor: Tetsuya Koike, Fujiyoshida (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 0 days.

(21) Appl. No.: 11/338,624

(22) Filed: Jan. 23, 2006

(65) Prior Publication Data

US 2006/0185897 A1  Aug. 24, 2006

(30) Foreign Application Priority Data

Jan. 24, 2005  (JP) .............................. 2005-014921

(51) Int. Cl.
*H01L 23/28* (2006.01)
(52) U.S. Cl. ........................ 174/521; 361/782; 361/790
(58) Field of Classification Search ................ 174/521, 174/527; 361/790, 782
See application file for complete search history.

(56) References Cited

U.S. PATENT DOCUMENTS 5,777,381 A * 7/1998 Nishida ....................... 257/693
6,317,324 B1 * 11/2001 Chen et al. .................. 361/704
6,784,530 B2 * 8/2004 Sugaya et al. ............... 257/686
2004/0160752 A1 * 8/2004 Yamashita et al. .......... 361/766

FOREIGN PATENT DOCUMENTS

JP  H11-163583  6/1999
JP  H11-237860  8/1999

OTHER PUBLICATIONS

Definition of inductor, answer.com, printed Jan. 16, 2007, p. 1-10.*

\* cited by examiner

*Primary Examiner*—Hung V. Ngo
(74) *Attorney, Agent, or Firm*—Brinks Hofer Gilson & Lione (57) ABSTRACT

A first substrate includes a coil assembly and an integrated circuit mounted thereon. A second substrate includes capacitors 16 and resistors mounted thereon. The first substrate and the second substrate are interconnected by an encapsulating medium. A conductive via is provided to electrically connect the first substrate and the second substrate together

3 Claims, 7 Drawing Sheets

ELECTRONIC PACKAGE AND PACKAGING METHOD

This application claims priority under 35 U.S.C. §119 to Japanese Patent Application No. 2005-014921 filed Jan. 24, 2005, the entire content of which is hereby incorporated by reference.

FIELD OF THE INVENTION

The present invention relates to electronic packages and a method for fabricating electronic packages.

BACKGROUND OF THE INVENTION

Figure 7A:
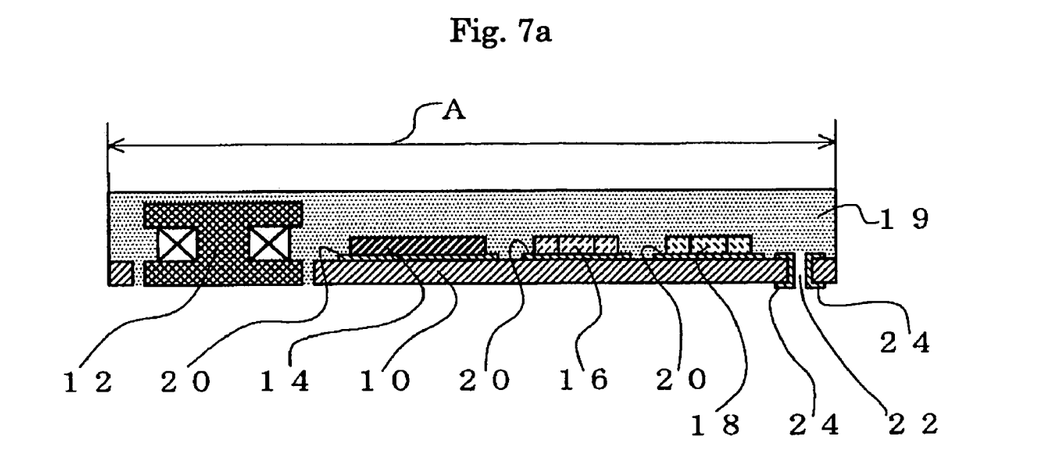
FIG. 7a is a sectional view of a conventional electronic package.
Figure 7B:
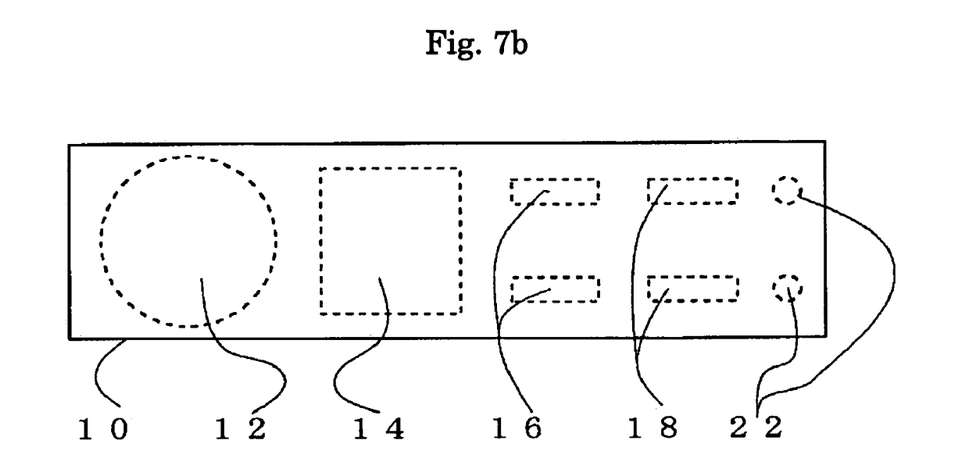
FIG. 7b is a plan view of the conventional electronic package.

Conventionally, to fabricate an electronic package particularly for use in an electroluminecent driver with a coil assembly, an integrated circuit, a coil assembly, capacitors, resistors and other electronic components are first mounted on a wafer. The electronic components are then encapsulated by an encapsulating epoxy resin. After the epoxy resin is cured, the wafer is diced to individual packages. FIGS. 7a and 7b are a sectional and plan view of such a conventional electronic package.

Specifically, the electronic package includes a substrate 10. A coil assembly 12, an integrated circuit 14, capacitors 16 and resistors 18 are mounted on the substrate 10 and electrically connected to a wiring metal film 20 which is, in turn, disposed on the substrate 10. All the components are encapsulated by an encapsulating resin 19. The wiring metal film 20 is electrically connected to a terminal or via. The via includes a through-hole 22 defined in the substrate 10 and a conductive element 24 made of metal and disposed on the side wall of the through-hole 22.

There is a need to reduce the size of the electronic package and shield the electronic components from electromagnetic noise.

To provide an electromagnetic shield, the surface of the encapsulating resin may, for example, be coated with nickel and other metals, as disclosed in Japanese patent application publication No. 11-163583. To enhance such a shielding effect, the encapsulating resin may be made of resin containing ferrite particles and coated with a metallic layer, as disclosed in Japanese patent application publication No. 11-237860.

None of those techniques, however, meets the above need to reduce the size of the electronic package.

The electronic package is also subject to warping, for example, during being mounted on the substrate of a cell phone and heated to a high temperature within a reflow oven.

It is, therefore, an object of the present invention to provide an electronic package and a packaging method which can eliminate the foregoing problems.

SUMMARY OF THE INVENTION

According to a first aspect of the present invention, there is provided an electronic package comprising a first substrate having a front surface and a back surface with at least one electronic component mounted thereon, a second substrate having a front surface and a back surface with at least one electronic component mounted thereon, and an encapsulating layer filled between the first and second substrates to encapsulate the at least one electronic component on the first substrate and the at least one electronic component on the second substrate and interconnect the first and second substrates.

In one embodiment, the electronic package includes a via for electrically connecting a wiring metal layer of the first substrate and a wiring metal layer of the second substrate together.

In one embodiment, the first substrate includes a coil assembly as an electronic component. The coil assembly has an end held in contact with the front surface of the second substrate.

In another embodiment, the first substrate includes a coil assembly as an electronic component. At least one of the first and second substrates includes a hole extending therethrough. The coil assembly has an end inserted into the hole.

In a further embodiment, the first substrate includes a coil assembly as an electronic component. At least one of the first and second substrates includes a recess in the front surface thereof. The coil assembly has an end inserted into the recess.

In one embodiment, the wiring metal layer of the first substrate is disposed over at least part of the back surface of the first substrate, and the wiring metal layer of the second substrate is disposed over at least part of the back surface of the second substrate.

According to a second aspect of the present invention, there is provide a method for fabricating an electronic package comprising the steps of providing a first substrate including at least one electronic component mounted on its front surface and a second substrate including at least one electronic component mounted on its front surface, and forming an encapsulating layer between the front surface of the first substrate and the front surface of the second substrate, with the first and second substrates oriented so that the front surface of the first substrate and the front surface of the second substrate face each other.

In the encapsulating layer forming step, an encapsulating medium may be applied to the front surface of the first substrate to encapsulate the electronic component, and the second substrate is placed over the encapsulating medium so that the electronic component on the second substrate is embedded in the encapsulating medium.

In the encapsulating layer forming step, an encapsulating sheet material may be sandwiched between the front surface of the first substrate and the front surface of the second substrate.

Optionally, a via may extend through the encapsulating medium so as to electrically connect the first and second substrates together.

Further, in the encapsulating layer forming step, the first and second substrates are placed so that the front surface of the first substrate and the front surface of the second substrate face each other, and an encapsulating resin may be then filled between the front surfaces of the first and the second subtracts.

As thus far explained, the present invention can reduce the size of the electronic package. The electronic package has two substrates, that is, upper and lower substrates. The two substrates cooperate together to retard expansion of the encapsulating medium which may occur when the substrates are heated to high temperatures, for example, in a reflow oven. In other words, the two substrates can reduce the amount of stress exerted on the electronic component(s). The present invention can thus provide a highly reliable and reduced-size electronic component.

DETAILED DESCRIPTION OF THE PREFERRED EMBODIMENTS

The present invention will now be described with reference to the accompanying drawings.

FIG. 1a through FIG. 2b show a method for fabricating an electronic package 80 (see FIG. 2b) according to the present invention.

Figure 2A:
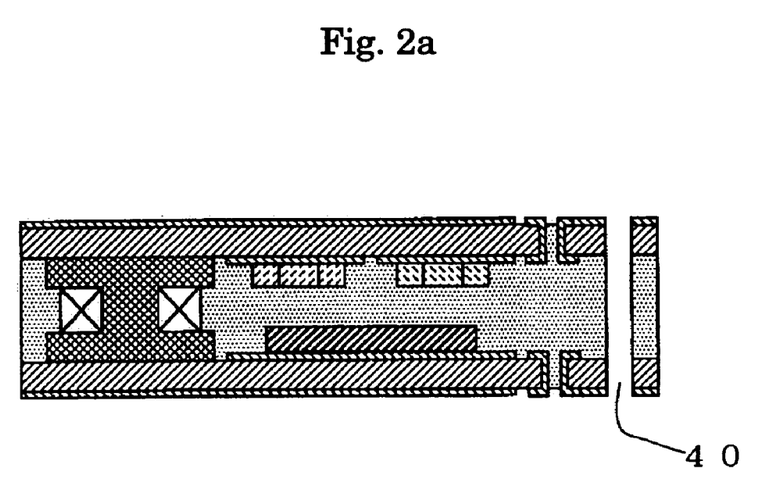
FIG. 2a is a sectional view of the electronic package with a via hole defined in the package.
Figure 2B:
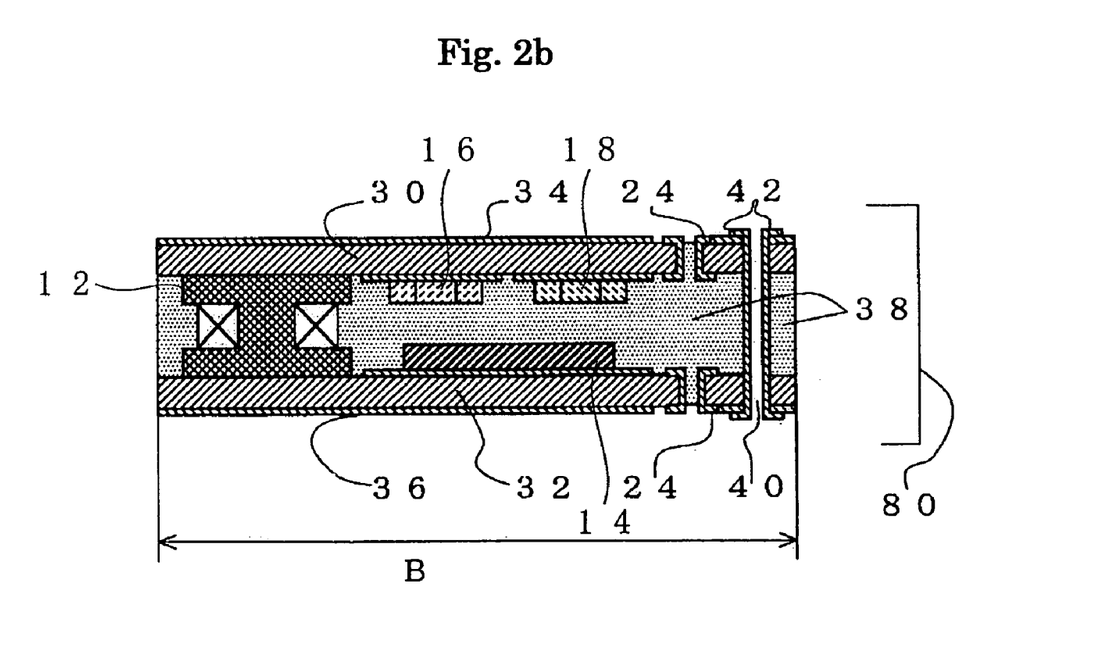
FIG. 2b is a sectional view of the electronic package with a via formed in the package.

As shown, the electronic package 80 includes a first and second substrate 30, 32 extending parallel to each other, a plurality of electronic components such as a coil assembly 12, an integrated circuit 14, capacitors 16 and resistors 18, and an encapsulating resin 38 provided between the first substrate 30 and the second substrate 32 to encapsulate the electronic components.

Figure 1A:
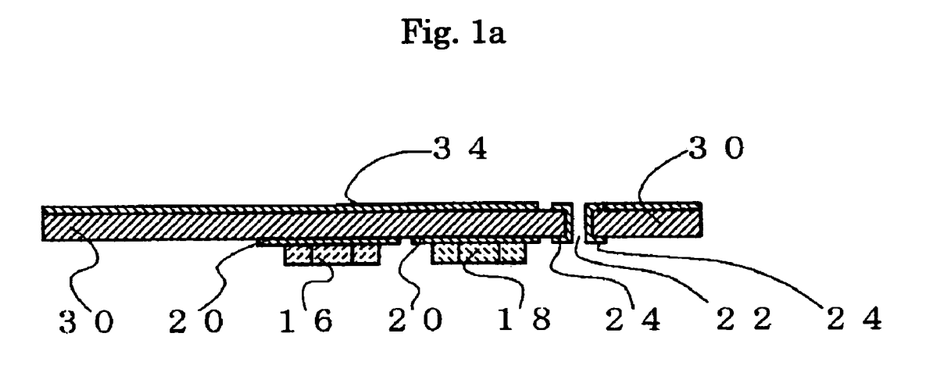
FIG. 1a is a sectional view of a first substrate of an electronic package according to one embodiment of the present invention, with various electronic components mounted on the first substrate.

As shown in FIG. 1a, the first substrate 30 has front and back surfaces (lower and upper surfaces as seen in FIG. 1a). A wiring metal film 20 and a wiring metal film 34 are disposed on the front and back surfaces, respectively. The capacitors 16, the resistors 18 are surface-mounted on the front surface of the first substrate 30. The first substrate 30 includes vias. Each of the vias includes a through-hole 22 and a conductive metal layer 24 formed in the through-hole. The conductive via provides an electrical connection between the wiring metal films 20, 34. The wiring metal film 34 is disposed over a substantial part of the back surface of the first substrate 30.

Figure 1B:
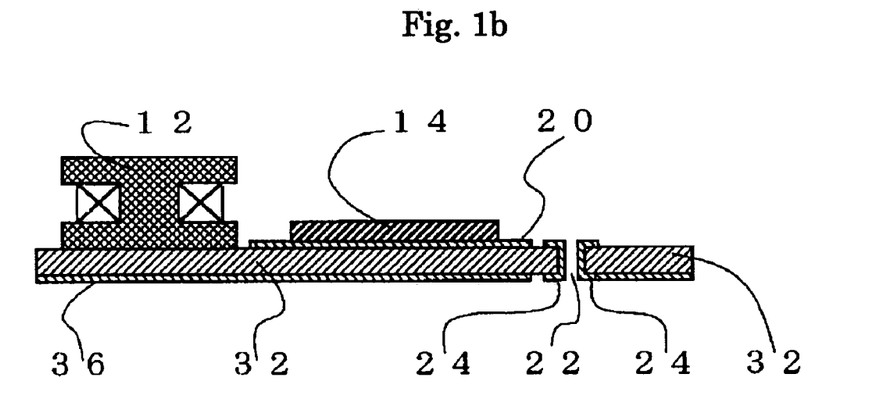
FIG. 1b is a sectional view of a second substrate of the electronic package, with various electronic components mounted on the second substrate.

Similarly, a wiring metal film 20 and a wiring metal film 36 are disposed on the front and back surfaces (upper and lower surfaces as seen in FIG. 1b) of the second substrate 32, respectively. The coil assembly 12 and the integrated circuit 14 are surface-mounted on the front surface of the second substrate 32. The second substrate 32 includes vias. Each of the vias includes the through-hole 22 and the conductive metal layer 24. The conductive via provides an electrical connection between the wiring metal films 20, 36. The wiring metal film 36 is disposed over a substantial part of the back surface of the second substrate 32.

Figure 1C:
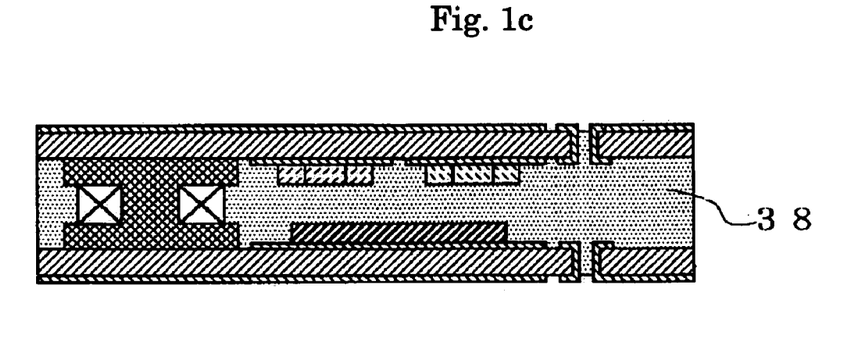
FIG. 1c is a sectional view of the electronic package after the first and second substrates are interconnected.

Referring to FIG. 1c, an encapsulating medium 38 is filled between the first substrate 30 and the second substrate 32 so as to interconnect the first substrate 30 and the second substrate 32 and also, encapsulate the electronic components 12, 14, 16, 18 on the first and second substrates 30, 32. The encapsulating medium may preferably be in the form of a pre-impregnated sheet material or a flux of a silicon or epoxy resin.

To interconnect the first and second substrates 30, 32, the first and second substrates are placed so that the front surface of the first substrate and the front surface of the second substrate face each other, and an encapsulating resin is then filled between the front surfaces of the first and the second substrates.

Alternatively, to interconnect the first and second substrates 30, 32, the encapsulating medium 38 is first applied over the front surface of one of the first and second substrates 30, 32 so as to cover the electronic components mounted thereon. The other substrate is then moved toward the substrate on which the encapsulating medium 38 has been applied until the front surface of the other substrate makes contact with the encapsulating medium 38. The encapsulating medium 38 is cured after air bubbles are removed from the encapsulating medium 38.

Further, as an alternative, a pre-impregnated sheet material may be sandwiched between the first and second substrates 30, 32.

Referring to FIG. 2b, the electronic package 80 includes a via. The via includes a through-hole 40 (see FIG. 2a) and a conductive metal layer 42 and provides an electrical connection between the wiring metal films 34, 36 of the first and second substrates 30, 32.

The electronic package 80 shown in FIG. 2b has a width B reduced by 25% as compared to the width A of the conventional package shown in FIG. 7a, for example, whereas the number of electronic components mounted on the electronic package 80 is the same as number of electronic components mounted on the conventional electronic package.

Advantageously, the electronic package 80 can be made thinner by displacing the integrated circuit 14, the capacitors 16, the resistors 18 and other low profile components from the coil assembly 12 and other high profile components in a direction parallel to the substrates of the electronic package 80.

The electronic package 80 is moisture proof as the wiring metal films 34, 36 occupy-a substantial part of the back or outer surfaces of the first and second substrates 30, 32, respectively. Advantageously, the electronic package 80 may be electromagnetically shielded by connecting the metallic wires 34, 36 to the ground. In order to enhance such a shielding effect, the wiring metal films may be extended over the sides of the electronic package 80 by way of selective plating as disclosed in Japanese patent application publication No. 11-16358 and No. 11-237860.

The upper and lower substrates 30, 32 cooperate together to prevent bending or warping of the electronic package 80 when heated to high temperatures, reduces the amount of stress exerted on the electronic components and protects the vias against high temperatures. The present invention can thus provide a highly reliable electronic package.

The present invention allows for packaging of not only the semiconductor devices, but also various active IC components such as the integrated circuit 14 and passive IC components such as the coil assembly 12, the capacitors 16 and the resistors 18.

In the illustrated embodiment, the coil assembly on the second substrate 32 is held in contact with the first substrate 30 and serves as a support for the second substrate 32. This configuration also protects other electronic components and gives high strength to the electronic package 80.

Figure 3:
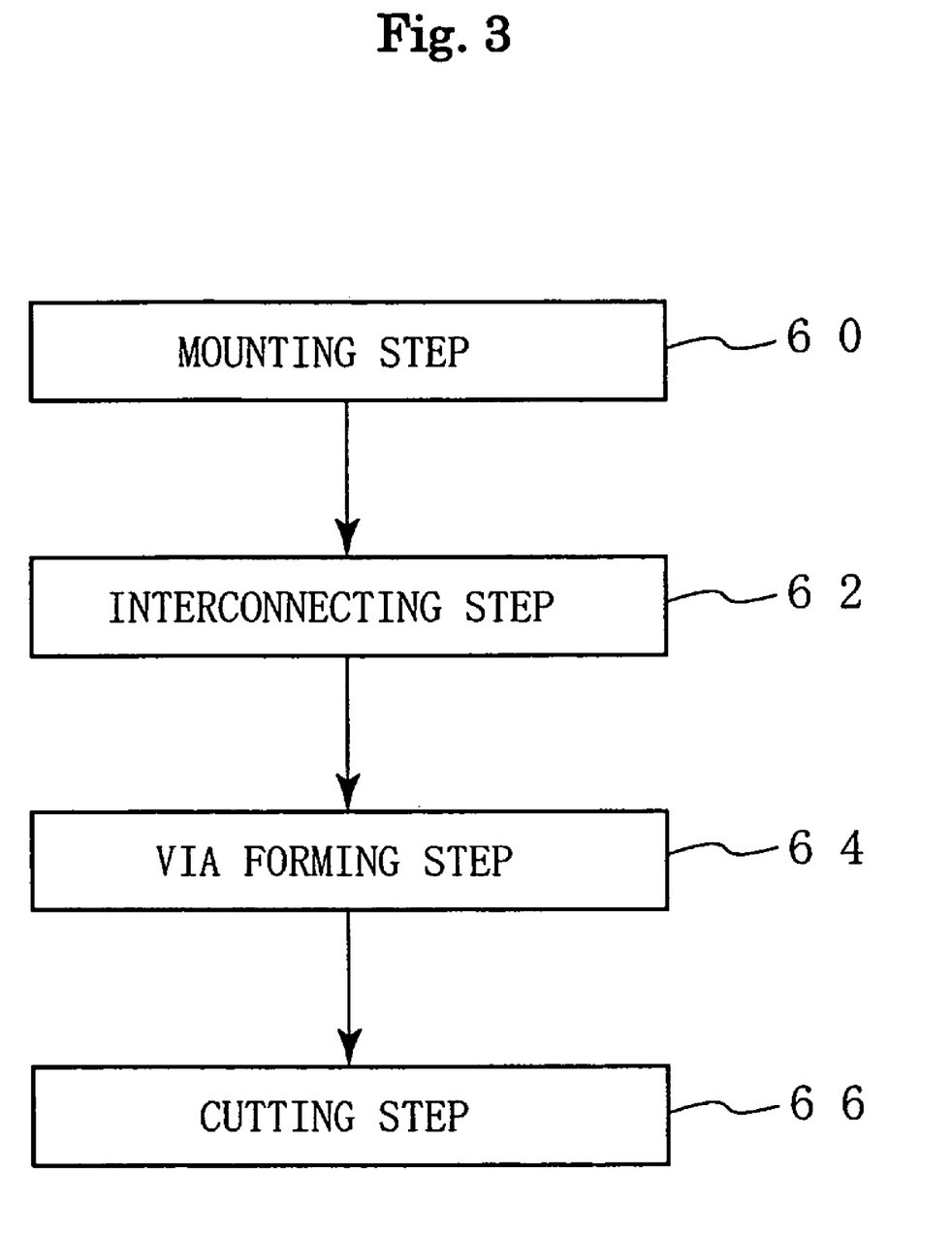
FIG. 3 is a flowchart showing the manner in which the electronic package is fabricated.
Figure 4A:
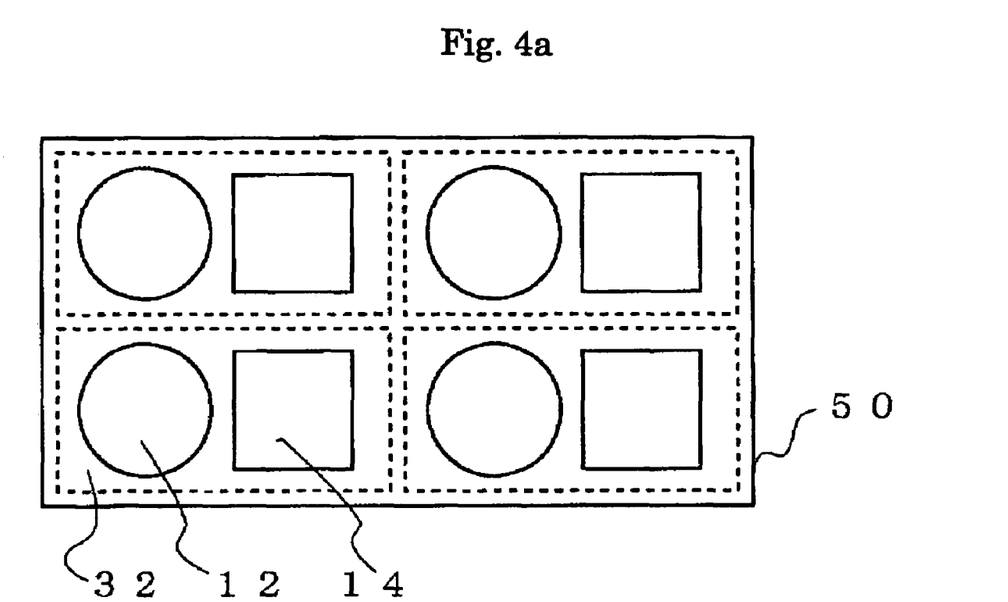
FIG. 4a is a plan view of a wafer from which four second substrates can be made.
Figure 4B:
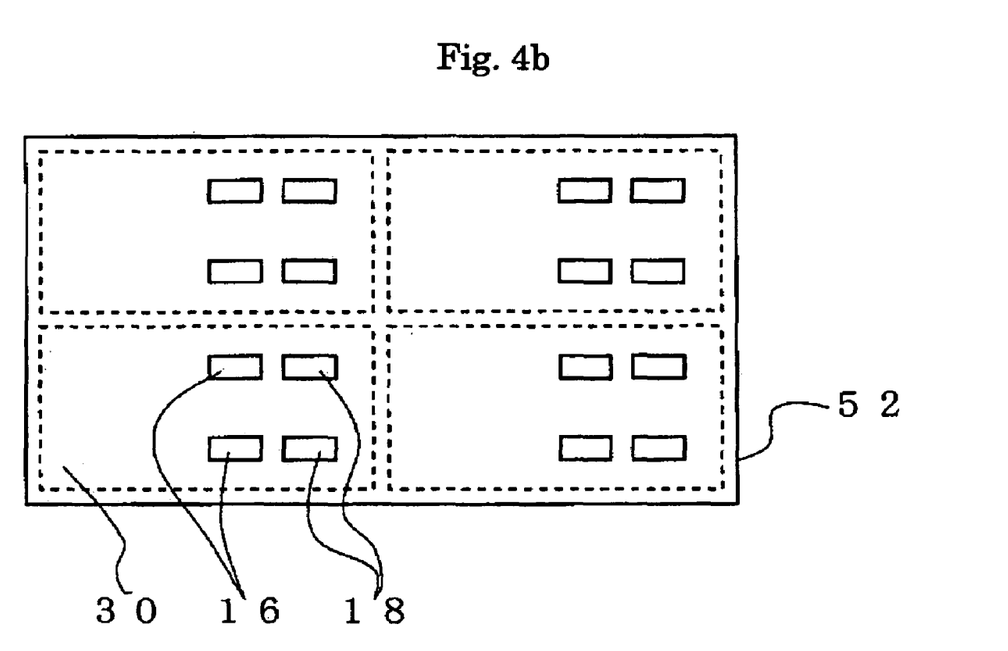
FIG. 4b is a plan view of a wafer from which four first substrates can be made.
Figure 5:
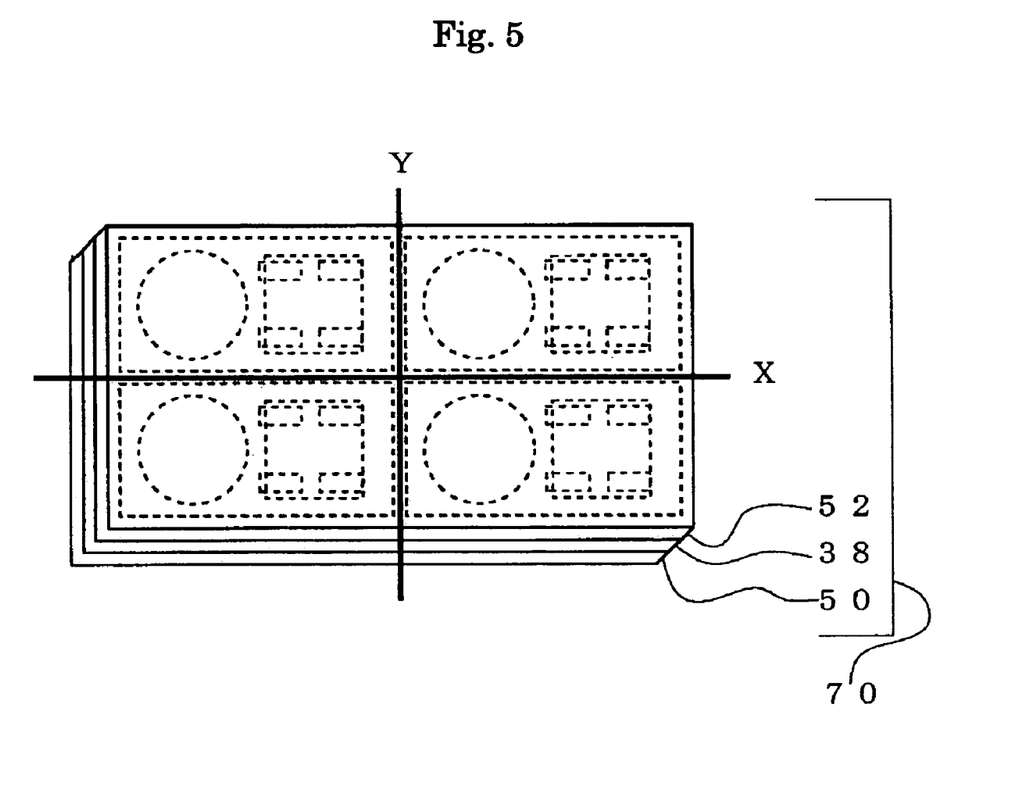
FIG. 5 shows the manner in which the wafers as stacked are cut into four independent electronic packages.

FIGS. 3 to 5 show a method for fabricating the electronic package 80 according to one embodiment of the present invention.

As shown in FIG. 3, this method includes a mounting step 60, interconnecting step 62, a via forming step 64, and a cutting step 66. Referring to FIGS. 4a and 4b, there is provided a wafer 50 with four sections each corresponding to the second substrate 32 and a wafer 52 with four sections each corresponding to the first substrate 30 of the electronic package 80. In the next, mounting step 60, the coil assembly 12 and the integrated circuit 14 are surface mounted on each section of the wafer 50, and also, the capacitors 16 and the resistors 18 are surface mounted on each section of the wafer 52. In the interconnecting step 62, the encapsulating medium is filled between the wafers 50, 52 with the wafers 50, 52 oriented so that the first and second substrates 30, 32 face each other. In the via forming step 64, the assembly of the interconnected wafers 50, 52 is formed with a via comprising the hole 40 and the conductive metal layer 42 as shown in FIG. 2b. In the cutting step 66, the wafers 50, 52 are cut into four pieces or to provide four independent electronic packages. It is preferable to pile a plurality of the wafer assemblies as denoted by reference numeral 70 to perform the cutting step.

The method of the present invention does not involve any costly step and can thus fabricate electronic packages at a low cost.

Figure 6:
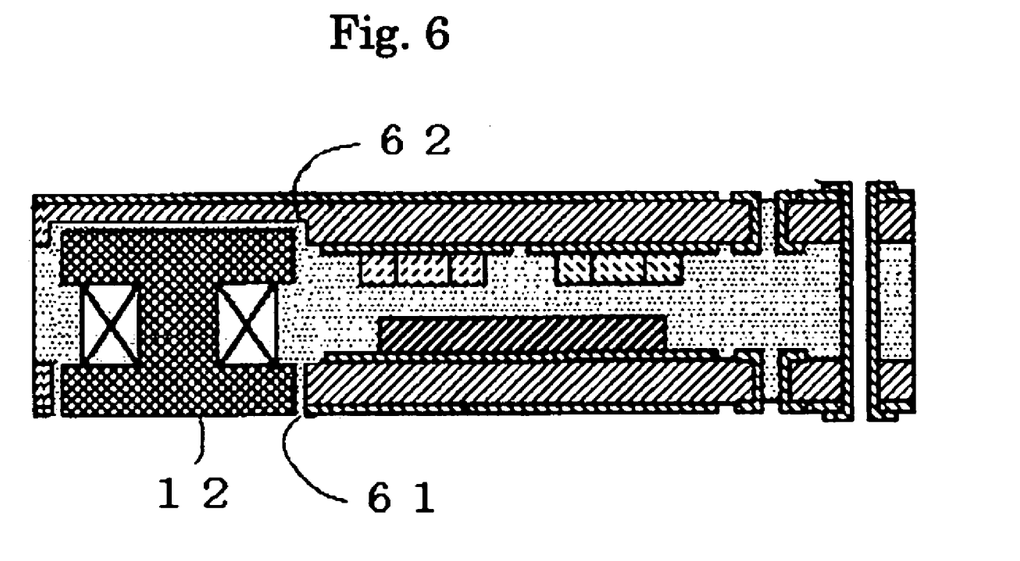
FIG. 6 is a sectional view of an electronic package according to another embodiment of the present invention.

FIG. 6 shows an electronic package fabricated according to another embodiment of the present invention. In this embodiment, the first substrate 30 is formed with a recess 62, and the second substrate 32 is formed with a hole 61. The coil assembly has opposite ends received in the recess 62 and the hole 61, respectively. This configuration facilitates positioning of the coil assembly and reduces the thickness of the electronic package.

Although the present invention has been described with respect to its preferred embodiments, the invention is-not limited thereto. For example, one or more of the integrated circuit, the coil assembly, the capacitors and the resistors may be omitted. Also, other types of electronic components may be used. In the illustrated embodiment, the electronic components are mounted on one side of each substrate. As an alternative to this embodiment, the electronic components may be mounted to both sides of each substrate. In the embodiment shown in FIG. 6, the recess is formed in the first substrate, whereas the hole is defined in the second substrate. Alternatively, either the recess or the hole may be formed in one of the first and second substrates. Still alternatively, either substrate may include either the recess or the hole.

Although the present invention has been described in terms of specific embodiments, it is anticipated that alternations and modifications thereof will no doubt become apparent to those skilled in the art. It is therefore intended that the following claims be interpreted as covering all such alternations and modifications as fall within the true sprit and scope of the invention.

What is claimed is:

1. An electronic package comprising:
    a first substrate having a front surface and a back surface,
    at least one coil assembly mounted on said front surface of said first substrate,
    a second substrate having a front surface and a back surface,
    at least one electronic component mounted on said front surface of said second substrate, and
    an encapsulating layer filled between front surfaces of said first and second substrates to encapsulate said at least one coil assembly on said front surface of said first substrate and said at least one electronic component on said front surface of said second substrate and interconnect said first and second substrates,
    wherein said coil assembly has an end held in contact with the front surface of said second substrate.

2. An electronic package comprising:
    a first substrate having a front surface and a back surface,
    at least one coil assembly mounted on said front surface of said first substrate,
    a second substrate having a front surface and a back surface,
    at least one electronic component mounted on said front surface of said second substrate, and
    an encapsulating layer filled between front surfaces of said first and second substrates to encapsulate said at least one coil assembly on said front surface of said first substrate and said at least one electronic component on said front surface of said second substrate and interconnect said first and second substrates,
    wherein at least one of said first and second substrates includes a hole extending therethrough, said coil assembly having an end inserted into said hole.

3. An electronic package comprising:
    a first substrate having a front surface and a back surface,
    at least one coil assembly mounted on said front surface of said first substrate,
    a second substrate having a front surface and a back surface,
    at least one electronic component mounted on said front surface of said second substrate, and
    an encapsulating layer filled between front surfaces of said first and second substrates to encapsulate said at least one coil assembly on said front surface of said first substrate and said at least one electronic component on said front surface of said second substrate and interconnect said first and second substrates,
    wherein at least one of said first and second substrates includes a recess in the front surface thereof, said coil assembly having an end inserted into said recess.

* * * * *